(12) United States Patent
Cottone et al.

(10) Patent No.: US 8,350,394 B2
(45) Date of Patent: Jan. 8, 2013

(54) ENERGY HARVESTER APPARATUS HAVING IMPROVED EFFICIENCY

(75) Inventors: Francesco Cottone, Tolentino (IT); Suresh Goyal, Warren, NJ (US); Jeff Punch, Patrickswell (IE)

(73) Assignees: Alcatel Lucent, Paris (FR); University of Limerick, Limerick (IE)

( * ) Notice: Subject to any disclaimer, the term of this patent is extended or adjusted under 35 U.S.C. 154(b) by 518 days.

(21) Appl. No.: 12/586,937

(22) Filed: Sep. 30, 2009

(65) Prior Publication Data

US 2011/0074162 A1 Mar. 31, 2011

(51) Int. Cl.
- F02B 63/04 (2006.01)
- F03G 7/08 (2006.01)
- H02K 7/18 (2006.01)
- F02B 67/04 (2006.01)

(52) U.S. Cl. ............ 290/1 R; 290/1 E; 322/2 A; 310/30
(58) Field of Classification Search ............... 290/1 R, 290/1 E; 310/30; 322/2 A
See application file for complete search history.

(56) References Cited

U.S. PATENT DOCUMENTS

| | | | | |
|---|---|---|---|---|
| 3,696,251 A * | 10/1972 | Last et al. | ............ | 290/53 |
| 4,423,334 A * | 12/1983 | Jacobi et al. | ............ | 290/53 |
| 4,851,704 A * | 7/1989 | Rubi | ............ | 290/53 |
| 5,144,847 A * | 9/1992 | Furtmayer | ............ | 73/862.625 |
| 5,347,186 A * | 9/1994 | Konotchick | ............ | 310/17 |
| 5,460,099 A * | 10/1995 | Matsuhisa et al. | ............ | 105/148 |
| 5,541,497 A * | 7/1996 | Shibayama | ............ | 322/4 |
| 5,552,657 A * | 9/1996 | Epstein et al. | ............ | 310/339 |
| 5,578,877 A * | 11/1996 | Tiemann | ............ | 310/15 |
| 5,818,132 A | 10/1998 | Konotchick et al. | ............ | 310/17 |
| 5,975,714 A * | 11/1999 | Vetorino et al. | ............ | 362/192 |
| 6,128,385 A * | 10/2000 | Goyal et al. | ............ | 379/433.01 |
| 6,220,719 B1 * | 4/2001 | Vetorino et al. | ............ | 362/192 |
| 6,539,803 B2 * | 4/2003 | Mochida | ............ | 73/504.12 |
| 6,700,248 B2 * | 3/2004 | Long | ............ | 310/80 |
| 6,729,744 B2 * | 5/2004 | Mah | ............ | 362/192 |
| 6,768,230 B2 | 7/2004 | Cheung et al. | ............ | 310/30 |
| 6,798,090 B2 * | 9/2004 | Cheung et al. | ............ | 310/17 |
| 6,808,288 B2 * | 10/2004 | Mah | ............ | 362/192 |
| 6,809,427 B2 * | 10/2004 | Cheung et al. | ............ | 290/1 R |
| 6,812,583 B2 * | 11/2004 | Cheung et al. | ............ | 290/1 R |

(Continued)

OTHER PUBLICATIONS

Adaptive Engery Product Brief, "Joule-Thief™ Demonstration Kit", RLPenergy.com 2 pages.

(Continued)

*Primary Examiner* — Pedro J Cuevas
(74) *Attorney, Agent, or Firm* — M. I. Finston (57) ABSTRACT

An improved vibrational energy harvester includes a housing and at least one energy transducer. In an embodiment, a second mass element is arranged to receive collisionally transferred kinetic energy from a first mass element when the housing is in an effective state of mechanical agitation, resulting in relative motion between the housing and at least one of the second and further mass elements. The energy transducer is arranged to be activated by the resulting relative motion between the housing and at least one of the second and further mass elements. In a further embodiment, kinetic energy is collisionally transferred in a velocity-multiplying arrangement from the first to a second or further mass element that has a range of linear ballistic motion. The energy transducer is arranged to be activated, at least in part, by the ballistic motion of the second or further mass element. The energy transducer, or a portion of it, may be attached to the housing, or it may be attached to another of the mass elements.

20 Claims, 9 Drawing Sheets

U.S. PATENT DOCUMENTS

| | | | | |
|---|---|---|---|---|
| 6,812,598 B2 * | 11/2004 | Cheung et al. | | 310/30 |
| 6,861,772 B2 * | 3/2005 | Cheung et al. | | 310/30 |
| 6,893,141 B2 * | 5/2005 | Mah | | 362/192 |
| 6,982,497 B2 * | 1/2006 | Rome | | 290/1 A |
| 6,984,902 B1 | 1/2006 | Huang et al. | | 310/26 |
| 6,994,450 B2 * | 2/2006 | Mah | | 362/192 |
| 7,009,315 B2 * | 3/2006 | Takeuchi | | 310/15 |
| 7,105,939 B2 * | 9/2006 | Bednyak | | 290/42 |
| 7,148,583 B1 * | 12/2006 | Shau et al. | | 290/1 R |
| 7,229,188 B2 * | 6/2007 | Mah | | 362/192 |
| 7,239,038 B1 * | 7/2007 | Zimmerman et al. | | 290/54 |
| 7,245,062 B2 * | 7/2007 | Schmidt | | 310/330 |
| 7,288,860 B2 * | 10/2007 | Cheung et al. | | 310/12.12 |
| 7,345,372 B2 * | 3/2008 | Roberts et al. | | 290/1 R |
| 7,367,212 B2 * | 5/2008 | Goyal et al. | | 73/12.04 |
| 7,367,214 B2 * | 5/2008 | Goyal | | 73/12.09 |
| 7,370,510 B2 * | 5/2008 | Goyal | | 73/12.09 |
| 7,391,123 B2 * | 6/2008 | Rome | | 290/1 R |
| 7,431,474 B2 * | 10/2008 | Mah | | 362/192 |
| 7,453,163 B2 * | 11/2008 | Roberts et al. | | 290/1 R |
| 7,464,800 B2 * | 12/2008 | Nerubenko | | 188/379 |
| 7,498,681 B1 * | 3/2009 | Kellogg et al. | | 290/1 R |
| 7,498,682 B2 * | 3/2009 | Lemieux | | 290/1 R |
| 7,501,726 B1 * | 3/2009 | Waters et al. | | 310/36 |
| 7,525,203 B1 * | 4/2009 | Racho | | 290/1 R |
| 7,538,445 B2 * | 5/2009 | Kornbluh et al. | | 290/53 |
| 7,557,456 B2 * | 7/2009 | Kornbluh et al. | | 290/42 |
| 7,649,276 B2 * | 1/2010 | Kornbluh et al. | | 290/53 |
| 7,692,320 B2 * | 4/2010 | Lemieux | | 290/1 R |
| 7,703,562 B2 * | 4/2010 | Kalik | | 180/8.1 |
| 7,781,935 B2 * | 8/2010 | Jager et al. | | 310/309 |
| RE41,626 E * | 9/2010 | Cheung et al. | | 310/30 |
| 7,847,421 B2 * | 12/2010 | Gardner et al. | | 290/1 R |
| 7,851,932 B2 * | 12/2010 | Rome et al. | | 290/10 |
| 7,902,698 B1 * | 3/2011 | Waters | | 310/36 |
| 7,989,971 B2 * | 8/2011 | Lemieux | | 290/1 R |
| 7,999,402 B2 * | 8/2011 | Freeland et al. | | 290/1 R |
| 8,022,563 B2 * | 9/2011 | Lemieux | | 290/42 |
| 8,030,786 B2 * | 10/2011 | Jackson et al. | | 290/1 R |
| 8,067,849 B2 * | 11/2011 | Stewart | | 290/53 |
| 8,069,938 B2 * | 12/2011 | Kalik | | 180/8.1 |
| 8,072,122 B2 * | 12/2011 | Gao et al. | | 310/339 |
| 8,222,754 B1 * | 7/2012 | Soliman et al. | | 290/1 R |
| 2002/0172060 A1 * | 11/2002 | Takeuchi | | 363/110 |
| 2004/0075363 A1 | 4/2004 | Malkin et al. | | 310/321 |
| 2004/0183306 A1 * | 9/2004 | Rome | | 290/1 R |
| 2004/0222637 A1 * | 11/2004 | Bednyak | | 290/1 R |
| 2004/0222638 A1 * | 11/2004 | Bednyak | | 290/1 R |
| 2005/0134149 A1 | 6/2005 | Deng et al. | | 310/339 |
| 2006/0192386 A1 * | 8/2006 | Rome | | 290/1 R |
| 2007/0188153 A1 * | 8/2007 | Jager et al. | | 322/2 A |
| 2007/0210580 A1 * | 9/2007 | Roberts et al. | | 290/1 R |
| 2007/0220949 A1 * | 9/2007 | Goyal et al. | | 73/12.04 |
| 2007/0220950 A1 * | 9/2007 | Goyal | | 73/12.09 |
| 2007/0257490 A1 * | 11/2007 | Kornbluh et al. | | 290/53 |
| 2007/0257491 A1 * | 11/2007 | Kornbluh et al. | | 290/53 |
| 2007/0266764 A1 * | 11/2007 | Goyal | | 73/12.09 |
| 2008/0016860 A1 * | 1/2008 | Kornbluh et al. | | 60/398 |
| 2008/0074083 A1 * | 3/2008 | Yarger et al. | | 320/137 |
| 2008/0164702 A1 * | 7/2008 | Brown et al. | | 290/1 E |
| 2008/0174120 A1 * | 7/2008 | Gardner et al. | | 290/1 C |
| 2008/0217926 A1 * | 9/2008 | Lemieux | | 290/1 R |
| 2009/0121493 A1 * | 5/2009 | Lemieux | | 290/1 R |
| 2009/0121494 A1 * | 5/2009 | Lemieux | | 290/1 R |
| 2009/0167034 A1 * | 7/2009 | Waters et al. | | 290/1 R |
| 2009/0218824 A1 * | 9/2009 | Freeland et al. | | 290/1 R |
| 2010/0045119 A1 * | 2/2010 | Jackson et al. | | 310/20 |
| 2010/0187835 A1 * | 7/2010 | Hohlfeld et al. | | 290/1 R |
| 2010/0194117 A1 * | 8/2010 | Pabon et al. | | 290/1 R |
| 2010/0236440 A1 * | 9/2010 | Rastegar | | 102/209 |
| 2010/0283264 A1 * | 11/2010 | Rastegar et al. | | 290/1 R |
| 2011/0012369 A1 * | 1/2011 | Grossman | | 290/1 R |
| 2011/0109102 A1 * | 5/2011 | McCoy et al. | | 290/1 R |
| 2011/0193350 A1 * | 8/2011 | Rastegar et al. | | 290/1 C |
| 2011/0215590 A1 * | 9/2011 | Arnold et al. | | 290/1 R |
| 2011/0316290 A1 * | 12/2011 | Kobayakawa | | 290/1 R |
| 2012/0104874 A1 * | 5/2012 | Hwang et al. | | 310/25 |
| 2012/0104877 A1 * | 5/2012 | Isaacs | | 310/30 |
| 2012/0161583 A1 * | 6/2012 | Kang et al. | | 310/339 |

OTHER PUBLICATIONS

B.S Hendrickson et al., "Harvest of Motion," Mechanical Engineering (ASME), vol. 130, No. 9 (Sep. 2008) pp. 56-58 + cover sheet.

* cited by examiner

ENERGY HARVESTER APPARATUS HAVING IMPROVED EFFICIENCY

FIELD OF THE INVENTION

The invention relates to energy harvesters, and more particularly to devices that convert energy from externally driven mechanical disturbances to electricity or other useful forms.

ART BACKGROUND

There has recently been a great deal of interest in harnessing, for useful purposes, some of the mechanical or kinetic energy in the environment that is a by-product of natural or artificial processes. Such energy includes, for example, the vibrations in machines, buildings, bridges, aircrafts, cars, and the human body and the motions of ocean waves. Depending on the nature of the source, their mechanical power spectra range from a few Hz to more than hundreds of kHz. Useful purposes that have been proposed include powering of sensors, as well as providing power for illumination and signal transmission.

Devices that capture mechanical energy from the environment and convert it to useful form are often referred to as "energy harvesters." In some energy harvesters known from the work of others, resiliently supported mass elements oscillate when they are driven by external vibrations and the like, and in turn, the oscillating elements drive transducers that convert the kinetic energy of the oscillating elements to electrical energy.

The effectiveness of such energy harvesters is reduced by various inefficiencies related, for example, to the mechanical coupling between the external energy source and the internal mass elements, and between the internal mass elements and the transducers. As a consequence, there remains a need for improvements in conversion efficiency.

SUMMARY OF THE INVENTION

We have found a new design for an energy harvester which can show significant improvements in the efficiency of energy conversion. In an embodiment, our harvester includes a housing, an energy supply unit from which energy is accessible to devices outside the housing, and at least one energy transducer coupled to the energy supply unit so as to feed energy to said unit when the transducer is activated.

In an embodiment, the harvester also includes a first mass element, a second mass element, and optionally, one or more further mass elements. Each of the mass elements has a range of motion within the housing. The second mass element (and optionally, further mass elements) is arranged to receive collisionally transferred kinetic energy from the first mass element when the housing is in an effective state of mechanical agitation, resulting in relative motion between the housing and at least one of the second and further mass elements. The energy transducer is arranged to be activated by the resulting relative motion between the housing and at least one of the second and further mass elements.

It should be noted in this regard that by "collisional transfer" of kinetic energy, we mean to include energy transferred through any interaction between one mass element and another. Thus, energy may be "collisionally transferred" directly from one body to another, or transferred indirectly through one or more intervening bodies. Collisional transfer may involve energy transferred through direct impacts, or it may involve energy transferred through an intervening medium that behaves at least approximately as an elastic cushion. Such intervening media may include, for example and without limitation, resilient suspensions such as springs of various kinds, as well as gas cushions and magnetic fields such as are provided by magnetic bearings.

In other embodiments, kinetic energy is collisionally transferred in a velocity-multiplying arrangement to a second or further mass element that has a range of linear ballistic motion. The energy transducer is arranged to be activated, at least in part, by the ballistic motion of the second or further mass element. The energy transducer, or a portion of it, may be attached to the housing, or it may be attached to another of the mass elements.

DETAILED DESCRIPTION

Several energy harvesters based on a single DOF oscillator are commercially available. Some limitations encountered with devices of this kind are narrow frequency band, power density per volume, and undesirably high resonant frequency at MEMS scale (i.e., a few kHz) that does not match the low frequencies of most sources, which are typically near 100 Hz or less. Application of the principles described below may mitigate any or all of these limitations.

Figure 1:
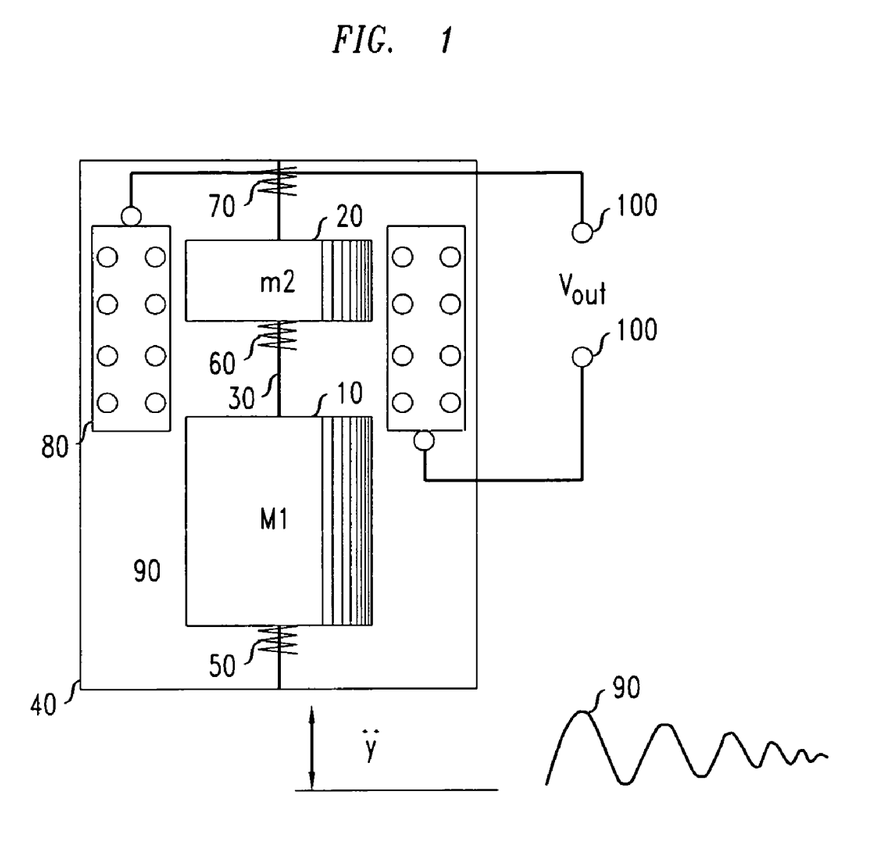
FIG. 1 is a schematic diagram of a 2 degrees-of-freedom (DOF) energy harvester according to the invention in an embodiment in which two collideable mass elements move ballistically along a linear path defined by a guiding rod, and transduction is electromagnetic.

An embodiment of the invention is shown schematically in FIG. 1. As seen in the figure, a mass element 10 of higher mass M1 and a mass element 20 of lower mass m2 move ballistically along a vertical path to which they are constrained by low-friction guiding rod 30. In referring to a body constrained to linear or planar motion, we mean by "ballistic" that except for the path constraints and except for collisions, the motion of the body is dominated by its own momentum, gravity, and pseudogravity, but is not dominated by friction and applied forces. (Of course some friction will be present, and forces, e.g. electromagnetic forces, exchanged with an energy transducer may also affect the ballistic motion to some extent.)

The mass elements and guiding rod are contained within a housing 40 to which the guiding rod is fixed. The housing is advantageously evacuated to reduce losses from air resistance. Highly restitutive spring elements 50 and 60, affixed respectively to the bottoms (as seen in the figure) of M1 and m2 act to prevent inelastic energy loss in collisions between M1 and the housing, and between M1 and m2. Likewise, highly restitutive spring element 70 serves as a stop and to prevent inelastic energy loss in collisions between m2 and the housing.

Energy transduction is provided by solenoidal coil 80, which in the shown embodiment is coaxial with guiding rod 30, which is concentric with the displacement axis of the mass elements. Mass element 20 (referred to hereinafter as "m2" except where there is a possibility of confusion) is wholly or partly composed of a permanent magnet. The magnetic field of m2 is conformed so that when m2 is set in motion, coil 80 is threaded by a time-varying magnetic flux. As a consequence, an output voltage $V_{out}$ is produced by electromagnetic induction. The output voltage is typically applied across a load resistance $R_L$, not shown in the figure.

In operation, the housing is in contact with an external source of mechanical disturbance 90, whose time-dependent vertical (as seen in the figure) acceleration is here denoted ÿ. In general, the mass of the energy harvester will be too small to affect the driving acceleration ÿ, which may be due, for example, to vibrations of a large machine or structure, or to displacements in a body of water. As a consequence, the non-inertial acceleration z̈ imparted to the mass elements relative to the housing, may in general be assumed equal to ÿ.

An alternative to coil 80 is an element comprising a magnetostrictive material such as Terefenol D, combined with an element comprising an electroactive material. In operation, the variable magnetic field causes a rotation of magnetization in the magnetostrictive material and the rotating magnetization generates a stress in magnetostrictive material. The stress is transmitted to the electroactive material, which responds by generating voltage.

As noted, the respective elements 10 and 20 are dissimilar in mass, with the mass M1 of element 10 being greater than the mass m2 of element 20. (As with element 20, element 10 will hereinafter be referred to as "M2" except where there is a possibility of confusion.)

Although alternate embodiments of the invention may, in fact, employ elements having the same mass, we have found that dissimilar masses provide certain advantages due to the principle of velocity multiplication. That is, as those skilled in the art will appreciate, the rebound velocity of the smaller of a pair of bodies undergoing a linear collision is $$\frac{(C+1)MV + (m-CM)v}{m+M},$$

where m and M are respectively the small and large masses of initial velocities v and V, and C is the restitution coefficient.

It will be seen that if M is much greater than m and the collision is perfectly elastic, i.e., C=1, then $V_f=V_i$ which means that the heavy body remains almost unaffected, while the smaller mass will gain velocity after the collision such that $v_f \approx 2V_i - v_i$. It should be noted that in the case where the masses were initially travelling in opposite directions with equal velocity $V_i = -v_i$, the final velocity of the smaller mass is tripled, i.e., $v_f \approx -3v_i$, whereas the final velocity tends to $2V_i$ if the smaller mass was initially at rest, i.e., $v_i = 0$.

We have found that applying the velocity amplification principle in our energy harvester can lead to significant gains in output power. That is, the generated electrical power will equal the mechanical power removed from the system by the electrically induced damping $d_e$ irrespective of the conversion technique deployed. Thus, the power delivered to the load is calculated as the product of the electrically induced force and the velocity of the inertial mass, so that it is proportional to the square of the mass velocity $P_{el} = d_e \cdot \dot{z}^2$. In the case of electromagnetic transduction, the output voltage at open circuit is defined by Faraday's law as $V_{oc}(t) = -\partial \Phi_B / \partial t = -NA(\partial B/\partial t)$ where N is the number of windings of the solenoid, A is its cross-sectional area and B is the perpendicular magnetic field applied over the area A. If the magnet is moving with velocity ż against a fixed coil as in FIG. 1, the induction law can also be expressed as $V_{oc}(t) = -Bl\dot{z}$ where l is the length of the solenoid wire. By considering a restitution coefficient $C_r = 0.86$, the final to initial velocity ratio becomes $v_f/v_i = 2$ for the mass ratio M/m=5. Therefore, it is reasonable to choose an effective range 5-100 for the mass ratio. Both smaller and larger mass ratios may also be effective. However, the inertial mass m should in any event not be made too small, because the electrical restoring force $F_{el} = -d_e \cdot \dot{z}$, which is responsible for the energy conversion, must be dominated by the driving mechanical force $F_m = -m \cdot \ddot{y}$.

Moreover, the electrical damping coefficient $d_e$ depends on the electrical load and the electromagnetic coupling between the coil and the magnetic field. A very high electrical damping will cause a very low velocity, and by contrast a very small electrical coupling will produce too small an output voltage. All these effects, in addition to the geometrical constraints, should be considered in the design of the harvester in order to find the optimal configuration.

When the energy harvester of FIG. 1 is put into operation, kinetic energy will be collisionally transferred from M1 to m2. Because coil 80 is fixed relative to the housing, the relative motion between m2 and the housing is equivalent to the relative motion between m2 and the coil. This relative motion causes an output voltage to be induced as explained above, and causes output electrical power to be generated when a load is present across output terminals 100.

Our invention encompasses numerous other embodiments that depart in one aspect or another from the embodiment illustrated in FIG. 1. For example, as noted above, M1 and m2 may be of equal mass. In other examples, both M1 and m2 may be made to interact with transducers, for example by providing both mass elements with magnets and installing a respective coil to interact with each mass element. In other examples, there may be further mass elements beyond m2, arranged to receive some of the initial kinetic energy of M1 through a chain of collisions. Some or all of these further mass elements may interact with transducers to produce output power.

It will be understood in this regard that an energy harvester having a single mass element constrained to a linear trajectory may be referred to as a single degree of freedom (DOF) design, and that each additional mass element (likewise constrained to a linear trajectory) adds a further DOF to the design. Thus, FIG. 1 illustrates one embodiment of an energy harvester having two degrees of freedom. In other embodiments, described below, a mass element may be mounted at the end of a deflectable cantilevered beam, such that it is constrained to move in an arc having a single rotational axis. Such an arrangement also has a single degree of freedom per mass element constrained in that fashion. Herein, we will refer to motion about an axis by a body removed some distance from the axis as "torsional" motion.

In other embodiments, collisional energy transfer takes place through direct impact, without the mediation of a spring or the like.

In other embodiments, one or both of M1 and m2 are anchored to the housing by a spring or the like.

Figure 2:
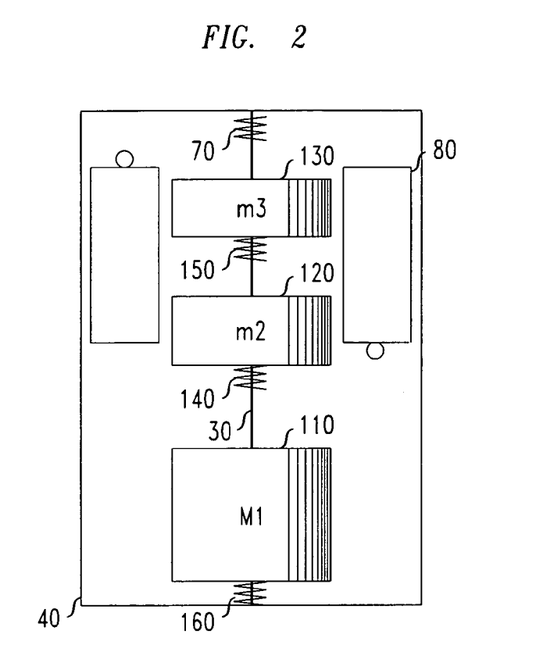
FIG. 2 is a schematic diagram of a 3 DOF embodiment in which one of the collideable mass elements is anchored to the housing by a spring, and transduction is electromagnetic.

Thus, for example, FIG. 2 shows schematically an arrangement for a three DOF device in which element 110 of largest mass M1 is anchored to the housing by spring 160, and element 120 of intermediate mass m2 is situated between element 110 and element 130 of smallest mass m3. The element of smallest mass m3 includes the permanent magnet that interacts with coil 80. As in FIG. 1, spring 70 affixed to the housing acts as a resilient stop to the motion of element 130, and collisions between the mass elements are mediated by spring 140 attached to the bottom of element 120, and by spring 150 attached to the bottom of element 130.

Figure 3:
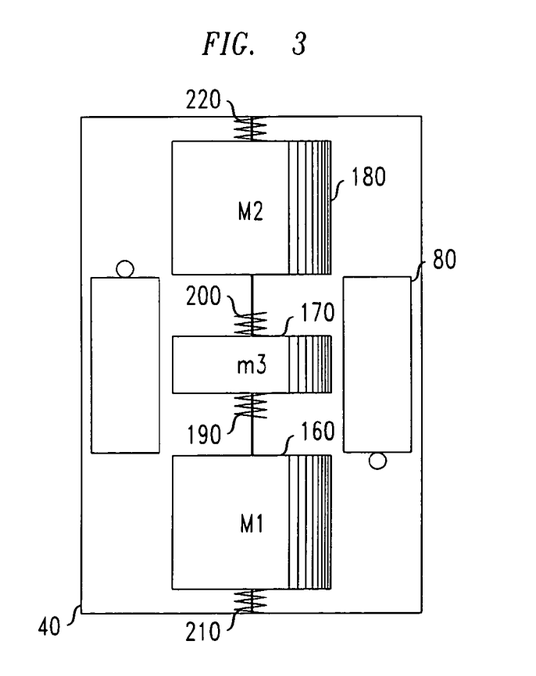
FIG. 3 is a schematic diagram of a 3 DOF embodiment in which two of the collideable mass elements are anchored to the housing by springs, and transduction is electromagnetic.

In a further example, FIG. 3 shows schematically another arrangement for a three DOF device in which mass elements 160 and 180, of respective (and possibly equal) masses M1 and M2 are respectively anchored to the bottom and top of the housing by springs 210 and 220. Element 170, which has a mass m3 smaller than both M1 and M2 is situated between elements 160 and 180. Element 170 includes the magnet for interacting with coil 80. Springs 190 and 200, attached respectively to the bottom and top of element 170, mediate the collisions between element 170 and the other two mass elements.

It should be noted that in use, the "bottom" and "top" of the device of FIG. 3 may be interchangeable.

Whereas in some embodiments, the displacement axis of the moveable bodies when in use is vertically oriented as shown in FIG. 1, in other embodiments the orientation is horizontal.

Other embodiments may employ a different type of transducer. Generally, known transduction mechanisms useful in this context fall into four categories: piezoelectric, electrostatic, electromagnetic and magnetostrictive.

Piezoelectric effects occur in polarized materials such as barium titanate, lead zirconate titanate, and zinc oxide. When a mechanical stress is exerted, the dipole alignment creates an electric voltage between opposite faces (parallel field $d_{33}$) or transversal sides (perpendicular field $d_{31}$).

The electrostatic method utilizes a variable capacitor subjected to a mechanical stress that varies its dielectric gap length. In this way, an opposing electrostatic force is produced in order to maintain the previous equilibrium position, causing an additional voltage to be produced across the plates.

FIG. 1 provides an example of the electromagnetic technique, in which relative motion between a magnet and a coil produces an induced voltage in accordance with Faraday's law. Typically, the magnetic field is produced by a permanent magnet. Either the magnet or the coil is selected to be the "stator", i.e., the element that is stationary relative to the housing, and the other is selected to be the moving element.

The magnetostrictive method is another type of electromagnetic conversion. In one example, a stress applied to a polarized ferromagnetic material such as Terefenol (chemical formula $Tb_xDy_{1-x}Fe_2$) produces a variable magnetic field that in turn induces a current in an adjacent conductive coil. In another example, noted above, magnetically induced stress in the magnetostrictive material is transmitted to an electroactive material that responds by generating a voltage.

Each of the transduction methods listed above has certain advantages and certain drawbacks that make it more suitable for some applications and device sizes, and less suitable for others. Those skilled in the art will appreciate these various advantages and drawbacks and will be able to make appropriate choices of transduction technology to suit particular applications and device sizes.

For example, piezoelectric transducers readily provide suitable output voltages and are well adapted for miniaturization, e.g. in MEMS applications. However, the electromechanical coupling coefficients for piezoelectric thin films are relatively small, and relatively large load impedances are typically required for the piezoelectric transducer to reach it optimum working point.

Variable capacitors are well suited for MEMS applications, but they have relatively low power density, and they need to be charged to a reference voltage by an external electrical source such as a battery.

Electromagnetic transducers are especially well suited for operation at relatively low frequencies in devices of medium size to drive loads of relatively low impedance. Bandwidth of the frequency response tends to decrease with increasing load. In this regard, an exemplary range for "low" mechanical frequencies is 10-100 Hz, a device may be considered to be of "medium" size if its maximum spatial dimension is 1-10 cm, and an exemplary range for "low" impedances is 1-1000 ohms.

Electromagnetic transducers are relatively expensive to integrate in microsystems because micromagnets are complex to manufacture, and relatively large mass displacements are required. Moreover, typical output voltages are relatively low, and circuitry for voltage regulation and energy storage may add further inefficiencies. Despite these drawbacks, however, electromagnetic generators at the centimeter scale have exhibited greater power densities than piezoelectric generators, and show promise even at smaller scales.

It will be appreciated that the electromagnetic transducer as shown, e.g., in FIG. 1 can be operated without direct physical contact, whereas a mechanical stress must be applied to transducers of the other kinds listed above. One arrangement for applying mechanical stress may be achieved, for example, by situating the transducer between m2 and the housing, as seen, e.g., in FIG. 1. That is, the transducer may be mounted on the top (as seen in the figure) of m2, or on the inner face of the housing, or it may be interposed between the housing and m2 by placing it, e.g., between a pair of springs or other resilient elements.

Figure 4:
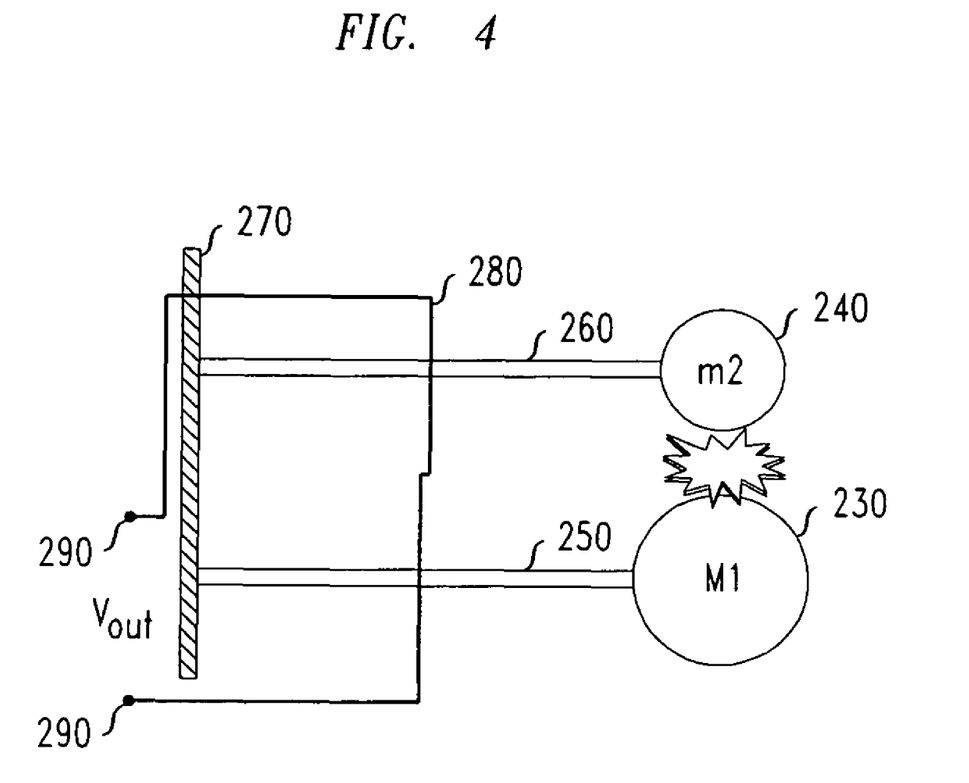
FIG. 4 is a schematic diagram of a 2 DOF embodiment in which transduction is piezoelectric and the motion of each of the mass elements is constrained by a flexible beam.

In other arrangements, a flexural stress may be applied to, e.g., a piezoelectric transducer. For example, FIG. 4 shows schematically an arrangement for a two DOF device employing mass element 230 of larger mass M1 and mass element 240 of smaller mass m2, mounted at the ends of respective cantilevered beams 250 and 260. Each of the beams is supported at the other end by a fixed anchor to wall 270 of the housing.

Beams 250 and 260 may be composed of piezoelectric material, or they may include piezoelectric material, exemplarily as a thin layer on the upper or lower beam surface. In one embodiment, for example, each of beams 250, 260 comprises a flexural steel plate on which bimorph piezoelectric layers have been deposited. The piezoelectric layers produce voltage when they are stressed along the transversal ($\sigma_{31}$) or perpendicular ($\sigma_{33}$) direction. Piezoelectrically generated voltage is conducted to output terminals 290 by electrical lead wires 280.

As shown in the figure, collisional energy transfer takes place by direct impact between the mass elements, which are for that purpose advantageously composed of, or encased in, a highly restitutive material. Alternatively, of course, the collisions may be mediated by springs, magnetic cushions, or the like.

Figure 5:
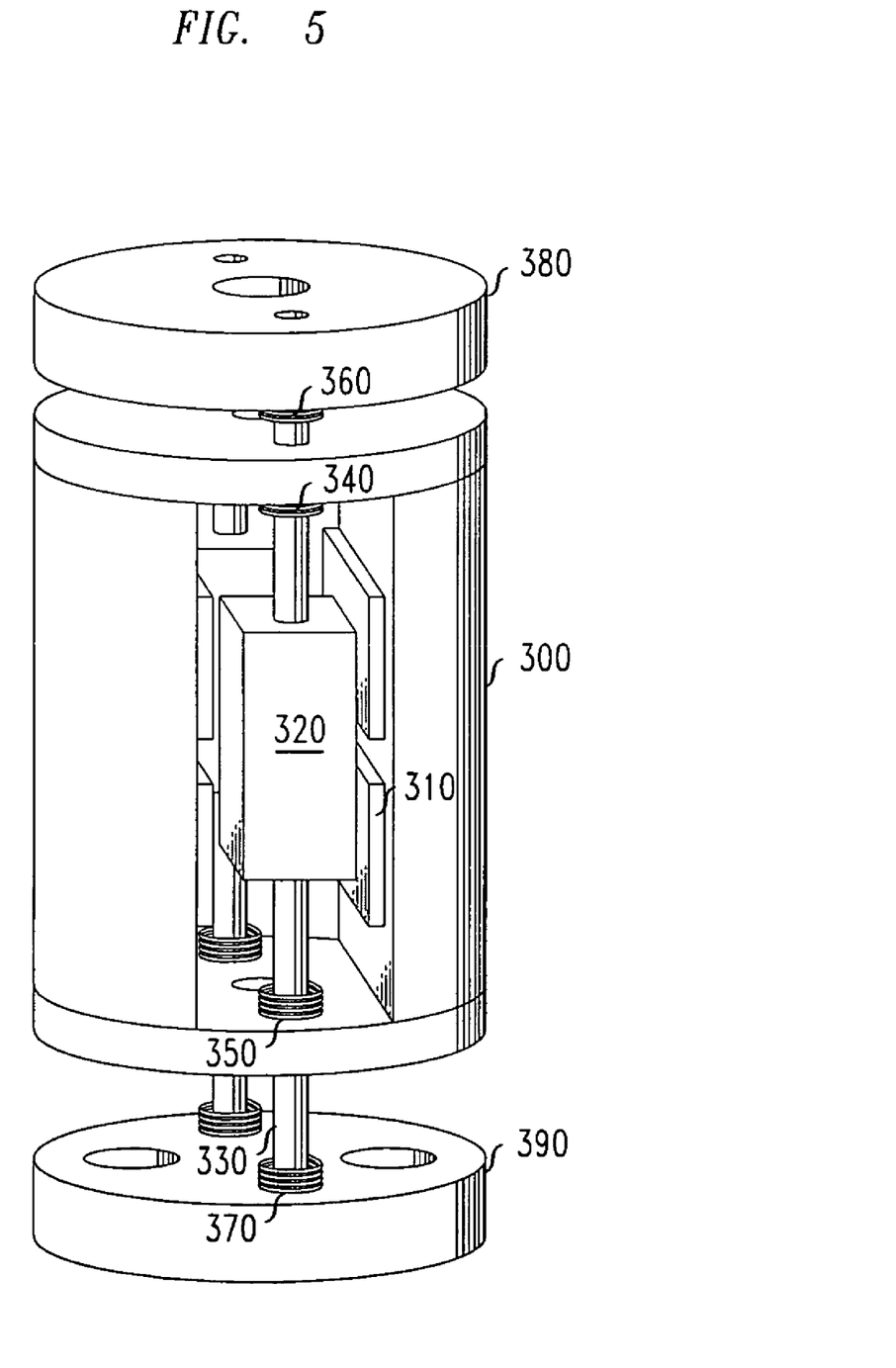
FIG. 5 is a simplified drawing of a 2 DOF embodiment in which the lighter mass has a range of ballistic motion relative to the heavier mass, and energy transduction is by voltage induction in a coil that moves with the smaller mass in the field of a magnetic array attached to the heavier mass.

FIG. 5 shows another embodiment of the invention, in which mass element 300, having larger mass M1, contains a cavity bridged by the magnetic field from an array of permanent magnets 310. Smaller mass element 320, having mass m2, has a range of one-dimensional ballistic motion within the cavity, constrained by guide rods 330. Spring (or other resilient cushion) elements 340, 350 are affixed respectively to the top and bottom of the cavity (as seen in the figure) and serve as stops at the ends of the range of motion of element 320. Element 300 likewise has a range of one-dimensional ballistic motion, which is constrained by guide rods 330 and terminated by spring (or other resilient cushion) elements 360, 370, affixed respectively to the top 380 and bottom 390 (as seen in the figure) of the enclosure.

Mass element 300 advantageously comprises a high-Q high permeability material such as non-oriented grain silicon steel or laminated steel, or ferrite, carbonyl, or another material characterized by high magnetic permittivity and low eddy current losses. The advantage of such materials is that they enable mass element 300 to serve as a magnetic flux closure yoke, which defines a magnetic circuit with the permanent magnet array 310. As a consequence, the magnetic flux lines are closed within the structure, and the magnetic energy is concentrated within the cavity.

The direction of the magnetic field produced by magnets 310 is advantageously made perpendicular to the plane defined by the guide rods 330. Mass element 320 includes a conductive coil (not shown in the figure) advantageously oriented with its normal axis parallel to the magnetic field so as to maximize the (time-dependent) magnetic flux threading the coil. The voltage induced by relative motion between the moving coil and the fixed magnetic field is conducted to output terminals by electrical lead wires (not shown in the figure).

One advantage of the arrangement depicted in FIG. 5 is that the larger mass element 300 not only transfers momentum to the smaller mass element, but also implements a powerful permanent gap magnet. A second advantage is that the magnetic field is entirely included within the structure, thus minimizing interference with external ferromagnetic materials.

It will be understood that the arrangement of FIG. 5 is a velocity-multiplying arrangement having two DOF. The energy conversion takes place due to relative motion between the lighter mass element and the magnet array, which constitutes part of the transduction means and in this arrangement is attached to the outer mass element. In the arrangement of FIG. 5, both the heavier mass element and the lighter mass element have a range of linear ballistic motion. In other embodiments, at least the heavier mass element 300 could instead be anchored by a spring or other resilient element, in which case its linear motion would be, e.g., harmonic instead of ballistic. In other embodiments, there may be a velocity-multiplying chain of three or more mass elements with the transducer activated by, e.g., the final and lightest element in the chain.

As noted, the energy transducer of FIG. 5 includes a coil that moves within a magnetic gap, with the magnetic field lines substantially perpendicular to the plane of the coil. In that arrangement, the magnetic field lines are also substantially perpendicular to the direction of motion of the coil.

More generally, any number of moving mass elements could be given a respective, corresponding electromagnetic transduction element. The use of more than one electromagnetic transduction element may improve both the bandwidth response of the energy harvester and its power density, i.e., its output power per unit volume.

In particular, the largest moving mass element may operate both to transfer momentum to one or more smaller elements, and to directly activate a transduction element. Because the overall power spectrum of the energy harvester is the result of the superposition of all of its vibrational modes, the direct participation of the largest mass element in transduction may advantageously broaden the electrical power spectrum at low frequencies.

It should be noted further that the springs or other elements that mediate collisions within the energy harvester may themselves also serve as electromechanical transducers. For example, a small piezoelectric bar or cantilever may at least partially convert collision impulses into useful electricity.

In at least some multiple transducer arrangements, we believe it is advantageous to employ a static (or relatively static) array of permanent magnets with multiple moveable coils, instead of static coils and moveable magnets. One advantage is avoidance of the dynamical complications that may arise from magnetic interactions among a plurality of small, powerful, moving magnets. Another advantage is avoidance of destructive interference, within a given coil, between the time-varying voltages induced by different moving magnets.

Figure 6:
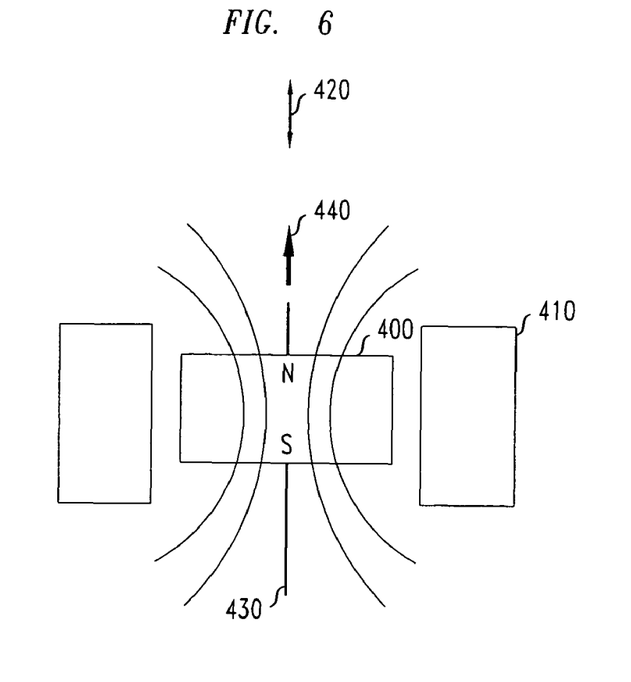
FIGS. 6 and 7 show the relative orientations of the coil, the magnetic field, and the direction of motion of the magnet in moving-magnet arrangements having a magnetic field coaxial (FIG. 6) and transverse (FIG. 7) to the motion of the magnet.
Figure 7:
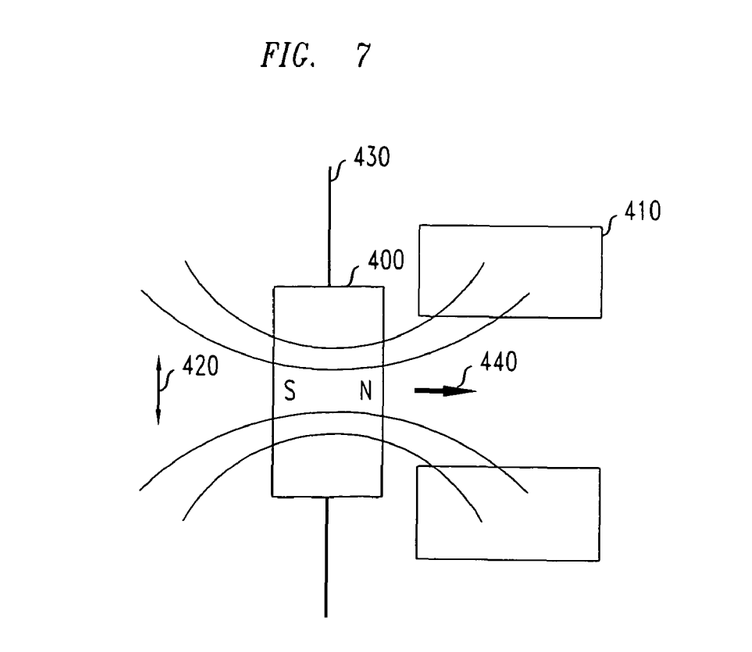

It should be noted in this regard that the axis of relative motion between the coil and the magnet may be coaxial with the magnetic field, or transverse to it. FIG. 5 provides an example of a transversal magnetic field in a moving-coil arrangement. FIG. 6 provides an example of a coaxial magnetic field in a moving-magnet arrangement, and FIG. 7 provides an example of a transversal magnetic field in a moving-magnet arrangement. Each figure shows magnet 400 moving relative to coil 410 in direction 420 on guide rod 430. The direction 440 of the magnetic field lines on the coil axis is also indicated in the figures.

The broad principles described here may also be realized in various other embodiments.

Figure 8:
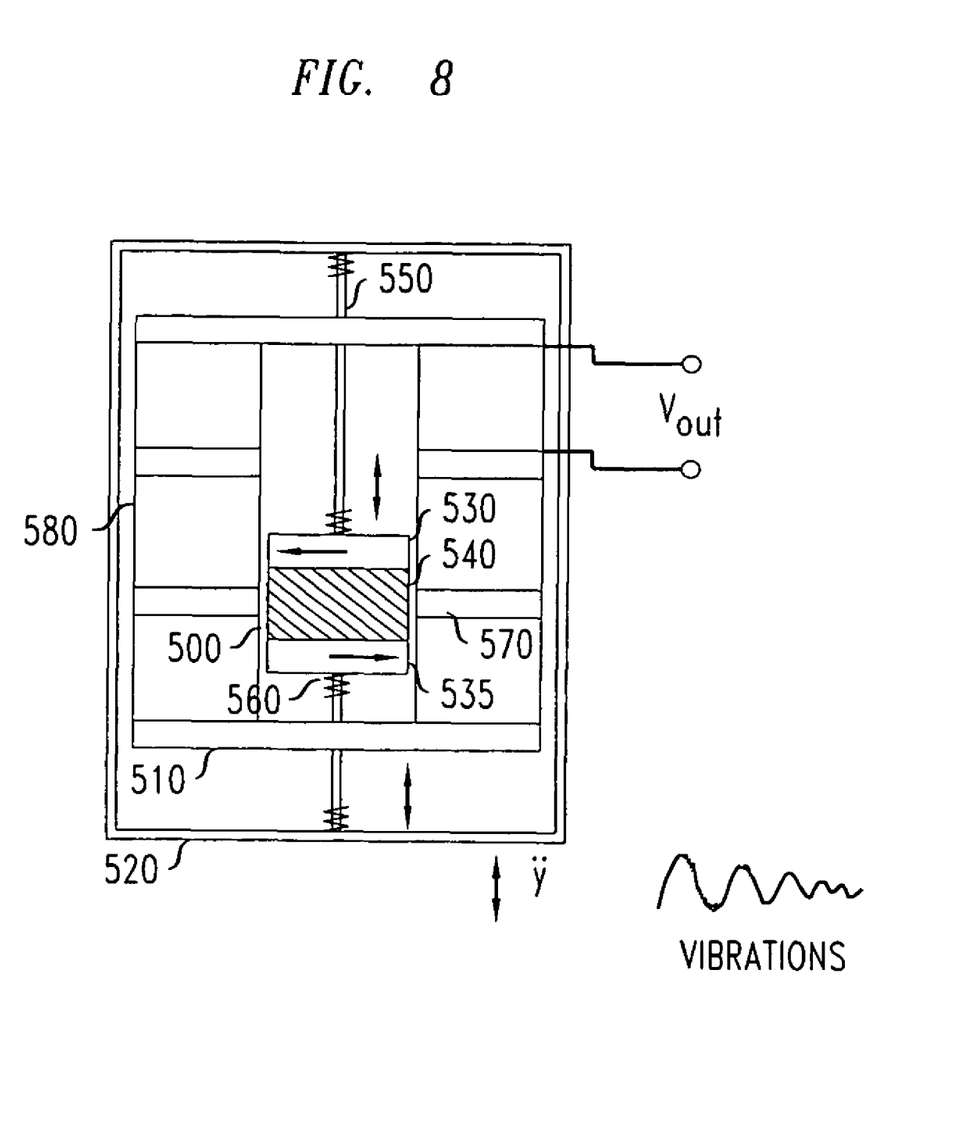
FIG. 8 is a schematic diagram of a 2 DOF embodiment in which the smaller mass element undergoes linear ballistic motion within the larger mass element.

For example, FIG. 8 shows an embodiment in which the smaller mass element m2, indicated in the figure by reference numeral 500, undergoes linear ballistic motion within the larger mass element M1, which is indicated in the figure by reference numeral 510. Mass element 500, in turn, undergoes linear ballistic motion within housing 520. Mass element 500 includes a pair of magnets 530, 535, having oppositely-directed horizontal flux (in the figure view) and separated by spacer 540. The mass elements are constrained to linear motion by low-friction shaft or guide 550. Collisions between mass element 510 and the housing and between the respective mass elements 500, 510 are mediated by springs 560. As noted above, the interior of the housing is advantageously evacuated to reduce air resistance.

The elements 580, three of which are shown in the figure on each side of larger mass element 510, are electroactive layers. Stacked between the electroactive layers are magnetostrictive layers 570. Layers 570 and 580 are included in mass element 510.

In operation, as explained above, reversals of the flux direction due to the motion of magnet array 530, 535 cause dimensional changes in the magnetostrictive layers that exert stress on the adjacent electroactive layers. As a consequence, the electroactive layers produce a voltage, which may be directed to output voltage terminals as shown in the figure. The respective electroactive layers material can be connected in a parallel or a series configuration, depending on whether is preferred to sum the individually output currents or voltages, respectively.

In a variation of the configuration described above, the elements 580 are solenoidal coils in which voltage is induced by the magnetic flux reversals, and the elements 570 are inert spacers.

Figure 9:
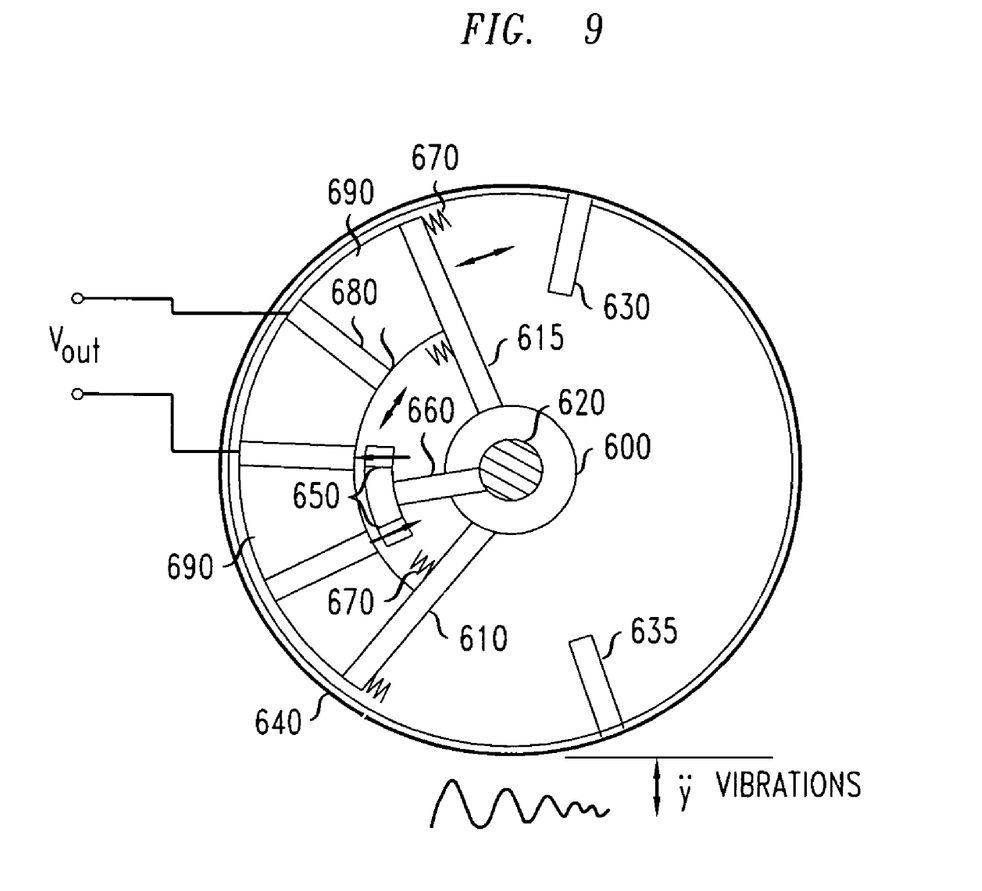
FIG. 9 is a perspective view of a 2 DOF embodiment in which the mass elements are constrained to one-dimensional rotational ballistic motion.

In a further example, FIG. 9 shows an embodiment in which the larger mass element M1, indicated in the figure by reference numeral 600, includes a pair of radially extending wings 610, 615 subtending a fixed angle of, e.g., 135 degrees and rotating as a unit on low-friction spindle 620 between stops 630, 635 within housing 640. The stops may have adjustable positions to define a variable range of rotational motion.

The smaller mass element m2, indicated in the figure by reference numeral 660, includes a single, radially extending wing that rotates on spindle 620 within a range of motion defined by wings 610, 615. The outer end of mass element 660 includes a pair of magnets 650 having opposite, radially directed magnetic flux. Collisions between mass element 600 and the stops, and between the respective mass elements, are mediated by springs 670.

Herein, we refer to the rotation of mass elements 600, 660 as torsional motion, because it involves the rotation of a body removed some distance from the rotational axis. In some embodiments, the torsional motion of the bodies may also be ballistic, in the sense that except for the path constraints and except for collisions, the motion of each body is dominated by its own momentum, gravity, and pseudogravity, but is not dominated by friction and applied forces.

The elements 680 are magnetostrictive layers stacked with intervening electroactive layers 690. In operation, as explained above with reference to FIG. 8, reversals in the flux direction experienced by the magnetostrictive layers due to the motion of mass element 660 cause the electroactive layers to produce a voltage, which may be summed and directed to output voltage terminals, as shown in FIG. 9.

In a variation of the configuration described above, the elements 690 are solenoidal coils in which voltage is induced by the magnetic flux reversals, and the elements 680 are inert spacers.

Although FIG. 9 shows the device being excited by externally applied linear vibrations (ÿ), it should be noted that the same device configuration may also be effectively excited by angular vibrations.

EXAMPLES

Experimental Prototype 1

Coaxial Magnetic Field and Moving Magnet

We constructed a prototype electromagnetic energy harvester dimensioned 50 mm in height and 20 mm in diameter according to a coaxial cylindrical design similar to FIG. 1. We used a lower mass M1 of 47.8 g and an upper mass m2 (including an embedded permanent magnet) of 4.3 g. Thus, the ratio of the respective masses was 11.1.

Figure 10:
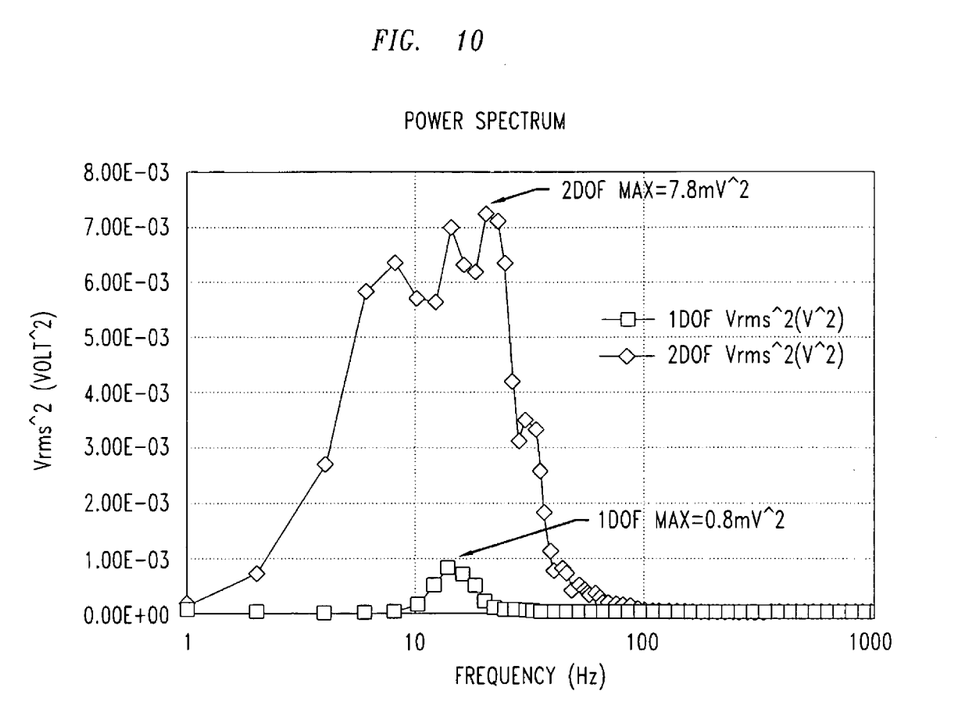
FIG. 10 shows comparative measured power spectra of a 2 DOF experimental prototype similar to FIG. 1 and a single-DOF system with the same total mass, volume and acceleration level.

The output power $\overline{P}_{\Delta f} = V_{rms}^2/R_L$ was measured by averaging the power spectral density of the load voltage signal over a time interval. FIG. 10 shows the power spectrum of the generated voltage across a pure resistive load of $R_L=200\Omega$ when driven by an input vibration having characteristics of Gaussian white noise. For comparison, the figure also shows the power spectrum of a single-DOF system with the same total mass, volume and acceleration level. More specifically, the upper curve in FIG. 10 is the power spectral density (PSD) of the output voltage across resistive load $R_L=200\Omega$, from the velocity-amplified prototype using an optimized coil with inductance L=16 mH and a NdFeB magnet with $B_z=0.2$ Tesla on its surface. The lower curve is the PSD of the output voltage across the same load, from a single spring-mass-damper oscillator of the same total inertial mass driven by white Gaussian noise vibration.

By giving a white Gaussian noise excitation up to 1.6 Khz, an interesting broadband response is illustrated in FIG. 10, mostly at low frequency in the range 6-13 Hz. This shows that the output voltage is almost constant over a frequency band 5 times wider than is typical for a single-DOF system. The total power calculated as the integral of the PSD curve is increased by up to eight times relative to the resonant configuration.

Experimental Prototype 2

Transversal Magnetic Field and Moving Coil

Two of the main problems of electromagnetic generators are their relatively low output voltage at low frequencies as well as their low energy density in comparison with piezoelectric systems. As the induced voltage across a solenoid with section A is defined by Faraday's Law $V(t)=-\partial\Phi_B/\partial t=-NA(\partial B/\partial t)$ large coil size and powerful magnets are necessary in order to increase the number of windings N and the magnetic flux density variation $\partial B/\partial t$. Although velocity amplification is helpful in overcoming these limitations, the coil size still limits the performance at small dimensions. The limitations can be now partially addressed by using neodymium NdFeB magnets and also by improving the assembly so that the flux field seen by the windings is maximized.

The above considerations were applied in a prototype design similar to FIG. 5. In the prototype, the sliding coil with its support (smaller mass) is free to move along the linear guides inside the gap magnet which acts as the heavier mass. The heavier mass M1, which measured 420 g, was free to slide along the linear guides, bouncing on the housing base and shaking the smaller mass m2 within itself. The smaller mass m2 measured 5.2 g, giving a relatively high value of 80.7 for the ratio of the respective masses.

High quality factor (i.e., high Q) elements such as wave weakly magnetic steel (or copper-berillium) springs may be used as mitigators to produce high restitution coefficient collisions. In further refinements, high quality factor piezoelectric cantilevers may be used to gather more energy from the impacts.

Both the coil and the gap magnet play the role of movers. If they move relatively out-of-phase (180 degrees), the relative velocity of the coil referring to the magnet is doubled with respect to a common stator-mover design.

A magnetic field of 0.85 Tesla was produced by commercial N42 neodymium permanent magnet with rectangular shape inside a 5 mm gap. The field can be increased up to, e.g., one Tesla by using the off-the-shelf N52 category of permanent magnet. Air core coils instead of iron core were chosen to avoid eddy currents losses and excessively strong nonlinear electromagnetic forces which could impede the velocity amplification of the lighter mass.

Figure 11:
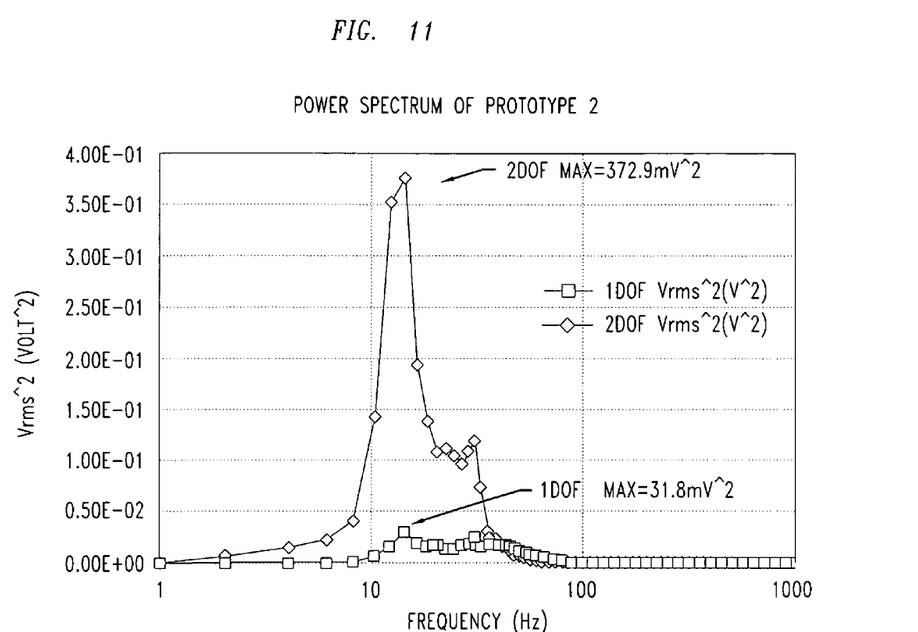
FIG. 11 shows comparative measured power spectra of a 2 DOF experimental prototype similar to FIG. 5 and a comparable single-DOF arrangement.

FIG. 11 shows the averaged power spectrum (PSD) of the output voltage of the velocity amplified double-DOF prototype, compared with a single-DOF arrangement. In both arrangements, the output voltage is measured across a load $R_L$ of 100.2 ohm, there is a total inertial mass of 450 g, and the vibrational input is Gaussian random noise of 6.5 m/s² maximum acceleration. The figure shows an improvement by a factor of five to ten in comparison with common 1-DOF oscillating systems.

It is important to note that the majority of reported generators have resonant frequencies of a hundred Hertz or more. By contrast, the peak frequency for prototype 2 is just 14 Hz which is suitable for harnessing energy from many more vibrational sources such as human motion, car, trucks, waves and the like.

The invention claimed is:

1. Apparatus comprising:
   (a) a housing;
   (b) a first and at least a second mass element, each said element having a range of motion within the housing;
   (c) an energy supply unit from which energy is accessible to devices outside the housing; and
   (d) at least one energy transducer coupled to the energy supply unit so as to feed energy to said unit when the transducer is activated, wherein:
   (e) at least the second mass element is arranged to receive collisionally transferred kinetic energy from the first mass element when the housing is in an effective state of mechanical agitation;
   (f) the energy transducer is arranged to be activated by relative motion between the housing and at least one said mass element other than the first, wherein said relative motion is excited by at least a portion of the kinetic energy collisionally transferred from the first mass element; and
   (g) at least one mass element arranged for activating the energy transducer is at least five times smaller in mass than the first mass element and is arranged so that the mass difference between itself and the first mass element causes it to undergo velocity multiplication relative to the first mass element.

2. The apparatus of claim 1, in which the collisional transfer of kinetic energy from the first to the second mass element is mediated by a spring.

3. The apparatus of claim 1, in which the energy transducer comprises a magnetic field source and at least one inductive coil.

4. The apparatus of claim 1, in which the energy transducer comprises at least one piezoelectric element.

5. The apparatus of claim 1, in which the energy transducer comprises at least one magnetostrictive element.

6. The apparatus of claim 1, in which the first and second mass elements are constrained to rectilinear motion.

7. The apparatus of claim 1, arranged for kinetic energy to be transferred through a sequence of decreasing masses from the first mass element to the energy transducer.

8. The apparatus of claim 1, in which the energy transducer comprises at least one piezoelectric element subject to flexure due to a reciprocating motion of at least one mass element.

9. The apparatus of claim 1, in which at least one mass element is suspended relative to the housing by a spring.

10. Apparatus comprising:
    (a) a housing;
    (b) a first and at least a second mass element, each said element having a range of motion within the housing;
    (c) an energy supply unit from which energy is accessible to devices outside the housing; and
    (d) at least one energy transducer coupled to the energy supply unit so as to feed energy to said unit when the transducer is activated, wherein:
    (e) at least the second mass element is arranged to receive collisionally transferred kinetic energy from the first mass element when the housing is in an effective state of mechanical agitation;
    (f) the energy transducer is arranged to be activated by relative motion between the housing and at least one said mass element other than the first, wherein said relative motion is excited by at least a portion of the kinetic energy collisionally transferred from the first mass element; and
    the apparatus further comprises at least one pair of mutually collidable mass elements that are supported relative to the housing by mutually independent suspensions.

11. Apparatus comprising:
    (a) a housing;
    (b) a first mass element and one or more further mass elements arranged in a velocity-multiplying arrangement in which the further mass elements are arranged to receive collisionally transferred kinetic energy from the first mass element when the housing is in an effective state of mechanical agitation, and in which at least one of the further mass elements is at least five times smaller in mass than the first mass element and is arranged so that the mass difference between itself and the first mass element causes it to undergo velocity multiplication relative to the first mass element;
    (c) an energy supply unit from which energy is accessible to devices outside the housing; and
    (d) at least one energy transducer coupled to the energy supply unit so as to feed energy to said unit when the transducer is activated, wherein:
    (e) at least one of the further mass elements having less mass than the first mass element has a range of ballistic motion; and
    (f) the energy transducer is arranged to be activated by the ballistic motion of said further mass element having a range of ballistic motion.

12. The apparatus of claim 11, wherein the energy transducer comprises a magnet and a coil, one of said magnet and coil being attached to said further mass element having a range of ballistic motion, and the other of said magnet and coil being attached to another of said mass elements.

13. The apparatus of claim 11, wherein the energy transducer comprises a magnet and a magnetostrictive element, said magnet being attached to said further mass element having a range of ballistic motion, and said magnetostrictive element being attached to another of said mass elements.

14. The apparatus of claim 11, wherein the first mass element and the one or more further mass elements each have a range of ballistic motion that is linear.

15. Apparatus comprising:
    (a) a housing;
    (b) a first mass element and one or more further mass elements arranged in a velocity-multiplying arrangement in which the further mass elements are arranged to receive collisionally transferred kinetic energy from the first mass element when the housing is in an effective state of mechanical agitation, at least one of the further mass elements having less mass than the first mass element;
    (c) an energy supply unit from which energy is accessible to devices outside the housing; and
    (d) at least one energy transducer coupled to the energy supply unit so as to feed energy to said unit when the transducer is activated, wherein:

(e) at least one of the further mass elements having less mass than the first mass element has a range of ballistic motion;

(f) the energy transducer is arranged to be activated by the ballistic motion of said further mass element having a range of ballistic motion; and at least one of the further mass elements has a range of ballistic motion lying within a cavity in the first mass element.

16. Apparatus comprising:

(a) a housing;

(b) a first and at least a second mass element, each said element having a range of motion within the housing;

(c) an energy supply unit from which energy is accessible to devices outside the housing; and (d) at least one energy transducer coupled to the energy supply unit so as to feed energy to said unit when the transducer is activated, wherein:

(e) at least the second mass element is arranged to receive collisionally transferred kinetic energy from the first mass element when the housing is in an effective state of mechanical agitation;

(f) the energy transducer is arranged to be activated by relative motion between the housing and at least one said mass element other than the first, wherein said relative motion is excited by at least a portion of the kinetic energy collisionally transferred from the first mass element; and (g) at least one of the mass elements is arranged to give and/or to receive collisionally transferred kinetic energy and is constrained to torsional motion.

17. The apparatus of claim 16, in which the first and second mass elements are constrained to torsional motion.

18. The apparatus of claim 17, wherein the torsional motion of at least one said mass element is due to flexure of a cantilevered beam.

19. The apparatus of claim 17, wherein the torsional motion of at least one said mass element is due to ballistic motion about a rotational axis.

20. The apparatus of claim 16, wherein the first mass element and at least one second mass element each have a range of ballistic motion that is torsional.

* * * * *